United States Patent
Hurwitz et al.

(10) Patent No.: US 12,381,534 B2
(45) Date of Patent: Aug. 5, 2025

(54) FILM BULK ACOUSTIC WAVE RESONATOR WITH BIFURCATED ELECTRODE

(71) Applicant: Zhuhai Crystal Resonance Technologies Co., Ltd., Zhuhai (CN)

(72) Inventors: Dror Hurwitz, Zhuhai (CN); Zhihui Fu, Tianjin (CN); Weiqiang Hu, Tianjin (CN)

(73) Assignee: Zhuhai Crystal Resonance Technologies Co., Ltd., Hengqin (CN)

( * ) Notice: Subject to any disclaimer, the term of this patent is extended or adjusted under 35 U.S.C. 154(b) by 922 days.

(21) Appl. No.: 17/480,233

(22) Filed: Sep. 21, 2021

(65) Prior Publication Data

US 2023/0087781 A1    Mar. 23, 2023

(51) Int. Cl.
| | |
|---|---|
| *H03H 9/17* | (2006.01) |
| *H03H 3/02* | (2006.01) |
| *H03H 9/02* | (2006.01) |
| *H03H 9/05* | (2006.01) |
| *H03H 9/13* | (2006.01) |

(52) U.S. Cl.
CPC .............. *H03H 9/173* (2013.01); *H03H 3/02* (2013.01); *H03H 9/02015* (2013.01); *H03H 9/0504* (2013.01); *H03H 9/131* (2013.01); *H03H 2003/021* (2013.01)

(58) Field of Classification Search
CPC .... H03H 9/173; H03H 9/131; H03H 9/02015; H03H 9/0504; H03H 9/02118; H03H 9/174; H03H 9/02543; H03H 9/058; H03H 9/1007; H03H 9/1064
See application file for complete search history.

(56) References Cited

U.S. PATENT DOCUMENTS

| | | | |
|---|---|---|---|
| 2009/0033177 A1* | 2/2009 | Itaya | H03H 9/02118 29/25.35 |
| 2010/0327697 A1* | 12/2010 | Choy | H03H 9/132 333/187 |
| 2011/0148547 A1* | 6/2011 | Zhang | H03H 9/02118 333/187 |
| 2021/0194456 A1* | 6/2021 | Luo | H03H 3/02 |
| 2021/0242855 A1* | 8/2021 | Luo | H03H 9/1035 |
| 2024/0162882 A1* | 5/2024 | Hu | H03H 9/174 |

* cited by examiner

*Primary Examiner* — J. San Martin
(74) *Attorney, Agent, or Firm* — Wiggin and Dana LLP

(57) ABSTRACT

An acoustic resonator that has a first electrode with a first planar portion. A second electrode having a second planar portion is disposed parallel to the first planar portion. This second electrode has a bifurcated end that defines a gap. A piezoelectric layer is disposed between and contacts both the first planar portion and the second planar portion. Also contacting the piezoelectric layer is the bifurcated end of the second electrode. The gap is formed in the periphery of each resonator within a filter. It is formed in the top electrode, that is typically formed of molybdenum, but could be formed from other metals as well. Unlike a gap between a top electrode and piezoelectric material, the gap recited herein is entirely within the second electrode. This structure is compatible with an inner passivation layer that enables a single crystal piezoelectric layer and a larger bottom electrode.

24 Claims, 21 Drawing Sheets

FILM BULK ACOUSTIC WAVE RESONATOR WITH BIFURCATED ELECTRODE

BACKGROUND

Wireless communication devices, such as cellular telephones, usually include radio frequency (RF) filters to improve both the reception and the transmission of signals. RF filters pass desired frequencies and reject unwanted frequencies enabling band selection and allowing the cellular telephone to process only intended signals. One preferred filter system utilizes resonators based on the piezoelectric effect because these filter systems facilitate overall system miniaturization. In piezoelectric-based resonators, acoustic resonant modes are generated in a piezoelectric material. The acoustic waves are converted into electrical waves for use in electrical applications.

Two common types of acoustic resonators are Surface Acoustic Wave Resonators (SAW) and Bulk Acoustic Wave Resonators (BAW). In Surface Acoustic Wave Resonators, an acoustic signal is carried by a surface wave. In Bulk Acoustic Wave Resonators, the acoustic signal is carried through the bulk of the resonator film. One type of BAW is a Film Bulk Acoustic Resonator (FBAR). The FBAR includes an acoustic stack having a layer of piezoelectric material disposed between two electrodes. Acoustic waves achieve resonance across the acoustic stack with the resonant frequency of the waves determined by materials making up the stack and the configuration of those materials. FBARs typically resonate in gigahertz (GHz) frequencies.

An FBAR and a method for manufacture is presented in U.S. Pat. No. 10,389,331 B2, titled "Single Crystal Piezoelectric RF Resonators and Filters," by the Applicant of the present patent application, Dror Hurwitz. U.S. Pat. No. 10,389,331 B2 is incorporated by reference herein in its entirety.

The quality of a resonator is given by its Q factor, a ratio of energy stored to power dissipated. A high Q factor indicates the filter loses little energy during operation. This translates to a lower insertion loss and a steeper skirt for differentiation of nearby bands. Ideally, a BAW or FBAR excites only thickness-extensional modes, longitudinal mechanical waves that travel in the direction of the thickness (z-axis) of the piezoelectric layer. Detrimentally, there are also lateral modes generated in the acoustic stack that travel parallel to the surface of the piezoelectric layer (x-axis and y-axis). These lateral modes impact the Q factor as energy is lost at the interfaces of the FBAR device.

U.S. Pat. No. 8,902,023 B2, titled "Acoustic Resonator Structure Having an Electrode with a Cantilevered Portion" by Choy et al., discloses forming a gap between a cantilevered electrode and the piezoelectric material in an FBAR. The gap is filled with a low acoustic impedance material, such as air, carbon, doped $SiO_2$, a dielectric resin or benzocyclobutene. The gap damps the lateral modes increasing the Q factor of the FBAR.

SUMMARY OF THE DISCLOSURE

Disclosed herein is an acoustic resonator that has a first electrode with a first planar portion. A second electrode having a second planar portion is disposed parallel to the first planar portion. This second electrode has a bifurcated end that defines a gap. A piezoelectric layer is disposed between and contacts both the first planar portion and the second planar portion. Also contacting the piezoelectric layer is the bifurcated end of the second electrode.

The gap is formed in the periphery of each resonator within a filter. It is formed in the top electrode, that is typically formed of molybdenum, but could be formed from other metals as well. Unlike the gap between a top electrode and piezoelectric material illustrated in U.S. Pat. No. 8,902,023 B2, the gap recited herein is entirely within the second electrode. This structure provides advantages as to yield and cost. Further, it is compatible with an inner passivation layer that enables a single crystal piezoelectric layer and a larger bottom electrode.

While a larger bottom electrode could appear to be a disadvantage by increasing the resonator size and the filter chip (die) size, in high-frequency (above 3 GHz) products and applications, and especially with scandium (Sc) doped piezoelectric products, the resonators become smaller in size, freeing space on the chip. The larger bottom electrode improves power handling by the filter.

DETAILED DESCRIPTION

Figure 1:
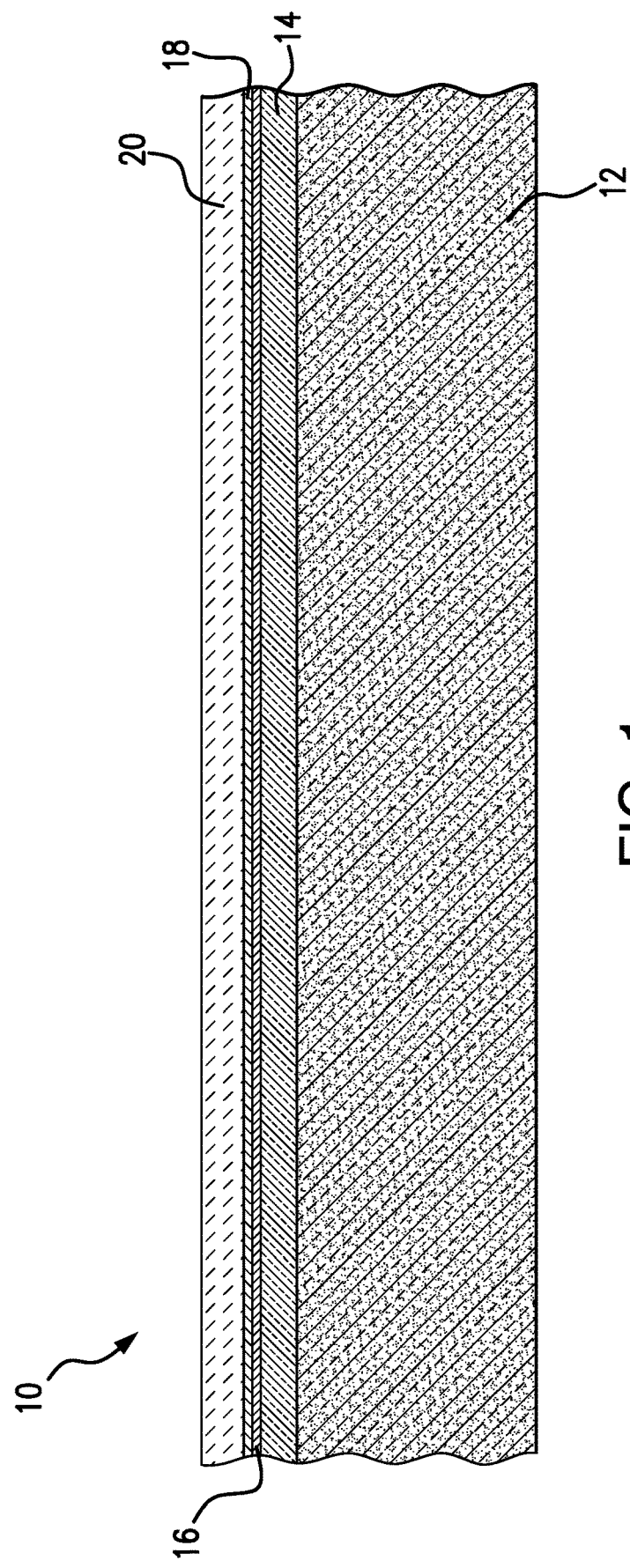
FIG. 1 is a cross-sectional view of a starting wafer in accord with a first step in a method of manufacture of an acoustic resonator as described herein.
Figure 20:
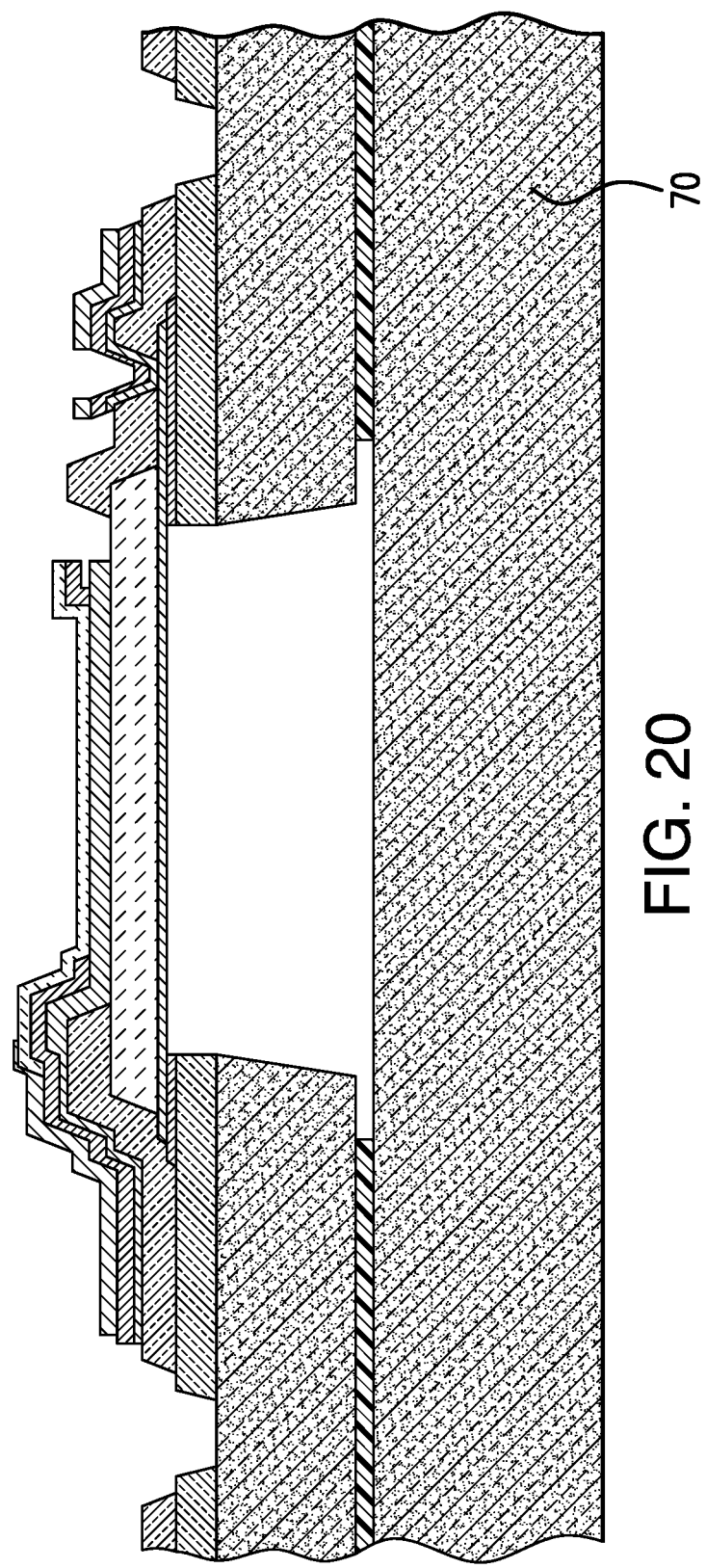
FIG. 20 illustrates a second step in encapsulating the acoustic resonator with an organic material.
Figure 21:
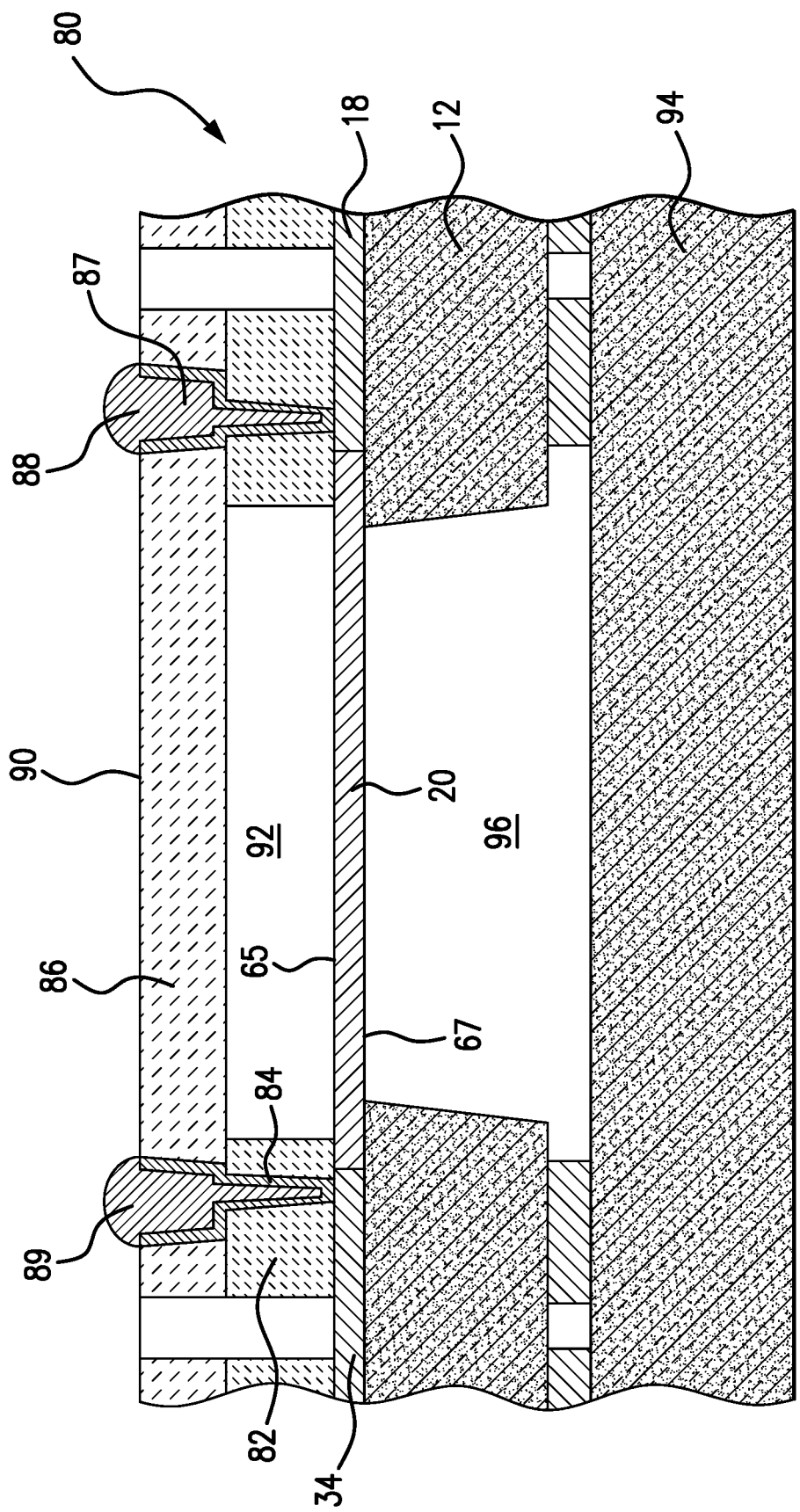
FIG. 21 illustrates a third step in encapsulating the acoustic resonator with an organic material.

A method for the manufacture of the acoustic resonator shown in FIG. 21 is described with reference to FIGS. 1-21. FIG. 1 is a cross-sectional view of a starting wafer 10 in accord with a first step in a method of manufacture. The starting wafer has a silicon handle 12 that is sufficiently thick to rigidly support subsequently deposited, such as by chemical vapor deposition, or formed, such as by thermal treatment, film layers. A buried oxide layer 14, $SiO_2$, is formed on a surface of the silicon handle 12 by a process such as Thermal Oxide (TOX) or by furnace or plasma enhanced Vapor Deposition (CVD) Oxide. The buried oxide layer is sufficiently thick to provide passivation enabling a bottom electrode to be larger than a piezoelectric layer. An exemplary thickness for the buried oxide layer is 1100 nanometers (nm).

A gold bonding layer 16 is deposited on the buried oxide layer 14. This gold bonding layer may be deposited directly on the buried oxide layer 14 or on an intervening titanium layer (not shown). An exemplary thickness for the gold bonding layer 16 is 500 nm. If the intervening titanium layer is present, an exemplary thickness for that intervening layer is 20 nm.

A molybdenum layer 18 is formed on the gold bonding layer 16 by a process such as magnetron sputter or other PVD process. The molybdenum layer 18 may be formed directly on the gold bonding layer or there may be an intervening titanium layer. If the intervening titanium layer is present, an exemplary thickness for that intervening layer is 20 nm. The molybdenum layer 18 will be formed into a first (bottom) electrode and has an exemplary thickness of 200 nm. A piezoelectric layer 20 contacts the first electrode 18. Exemplary thicknesses for the piezoelectric layer range from 200 nm to 1100 nm dependent on the required filter frequency response needs. A thinner thickness piezoelectric layer, typically below 300 nm, is useful for frequencies above 5 GHz while a thicker thickness, above 500 nm, provides filters with a frequency response lower than 3 GHz. A preferred material for the piezoelectric layer is single crystal aluminum nitride (AlN). More preferred is doping the single crystal aluminum nitride with scandium (Sc) to achieve wider band filters.

Figure 2:
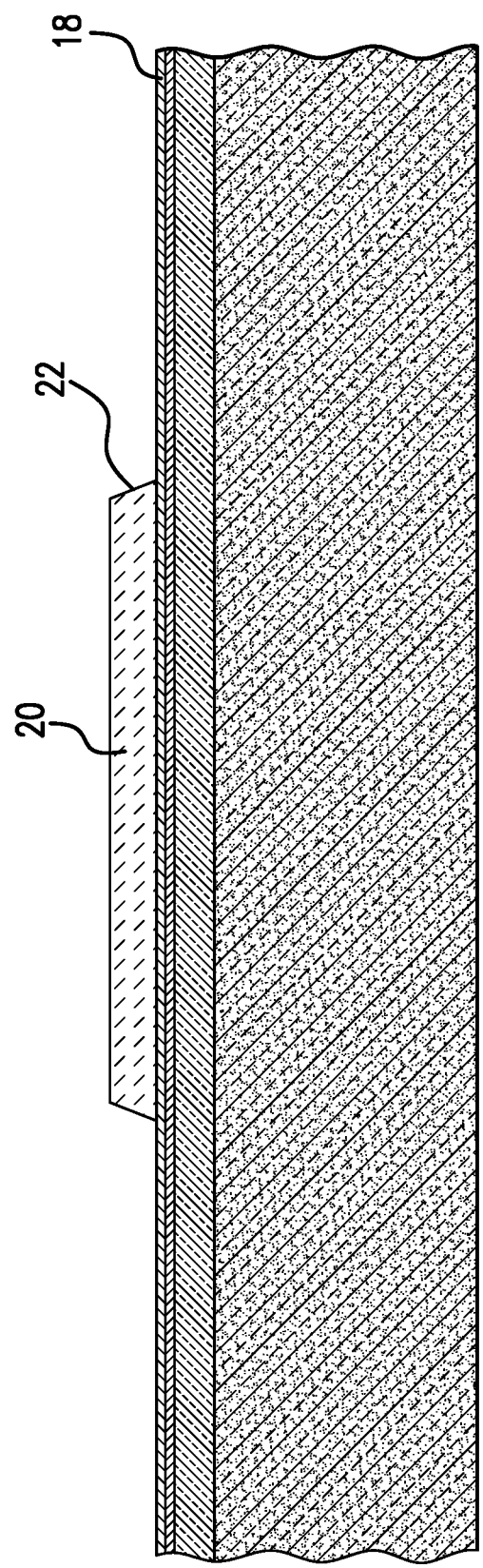
FIG. 2 is a cross-sectional view illustrating etching a piezoelectric layer in accord with a second step in the method of manufacture.

FIG. 2 illustrates forming the aluminum nitride piezoelectric layer 20 to a desired configuration by etching. Surfaces to be retained are coated with a desired resist. Exemplary are a photoresist or a low temperature (350° C. or lower) silicon oxide hard mask. Etch conditions are selected to minimize the removal of molybdenum from the first (bottom) electrode 18 to less than 100 nanometers. Suitable etch materials include KOH and a chlorine-based dry etch. A taper 22 is formed in the edges of the piezoelectric layer 20 to provide a profile for top electrode (Mo/Au) step coverage as will be described below. The angle of the taper 22, measured where the sidewalls of the piezoelectric layer 20 meet the first electrode 18, is 60° or less.

Figure 3:
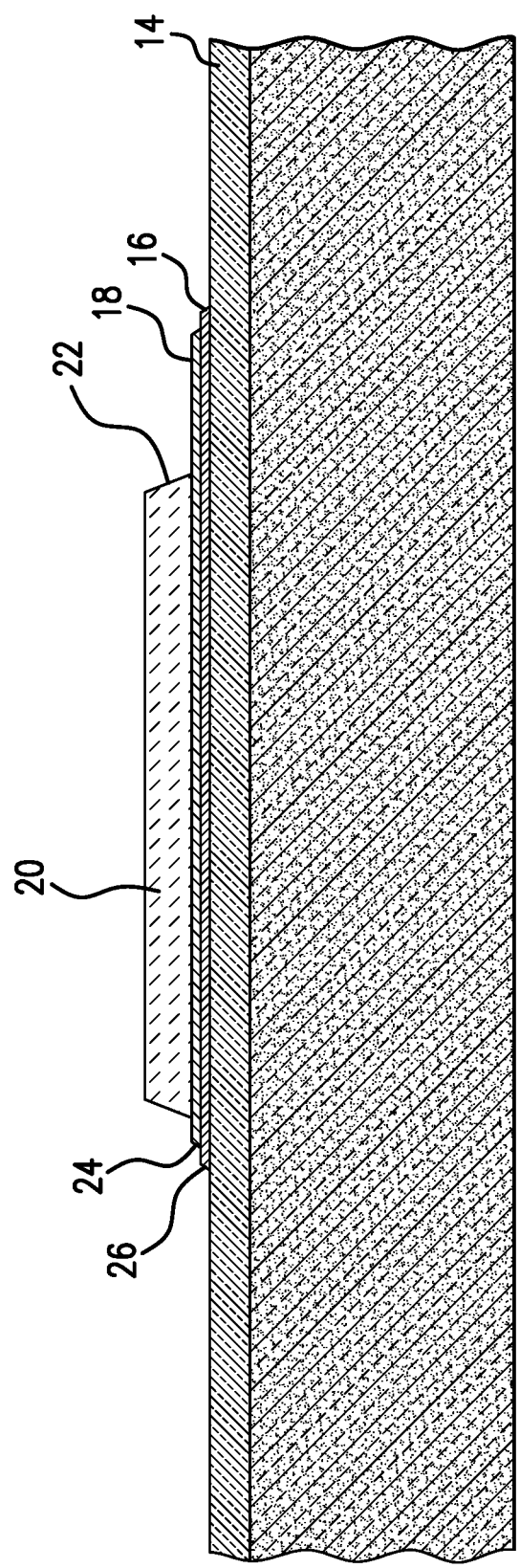
FIG. 3 is a cross-sectional view illustrating etching a first (bottom) electrode and a gold bonding layer in accord with a third step in the method of manufacture.

FIG. 3 illustrates etching of the first (bottom) electrode 18 and gold bonding layer 16 in accord with a third step in the method of manufacture. A suitable etch material is argon or other inert gas dry etch that will not affect the buried $SiO_2$ layer 14. Tapers 24, 26 formed in the first (bottom) electrode and the gold bonding layer have approximately the same angle as the taper 22 in the sidewalls of the piezoelectric layer 20.

Figure 4:
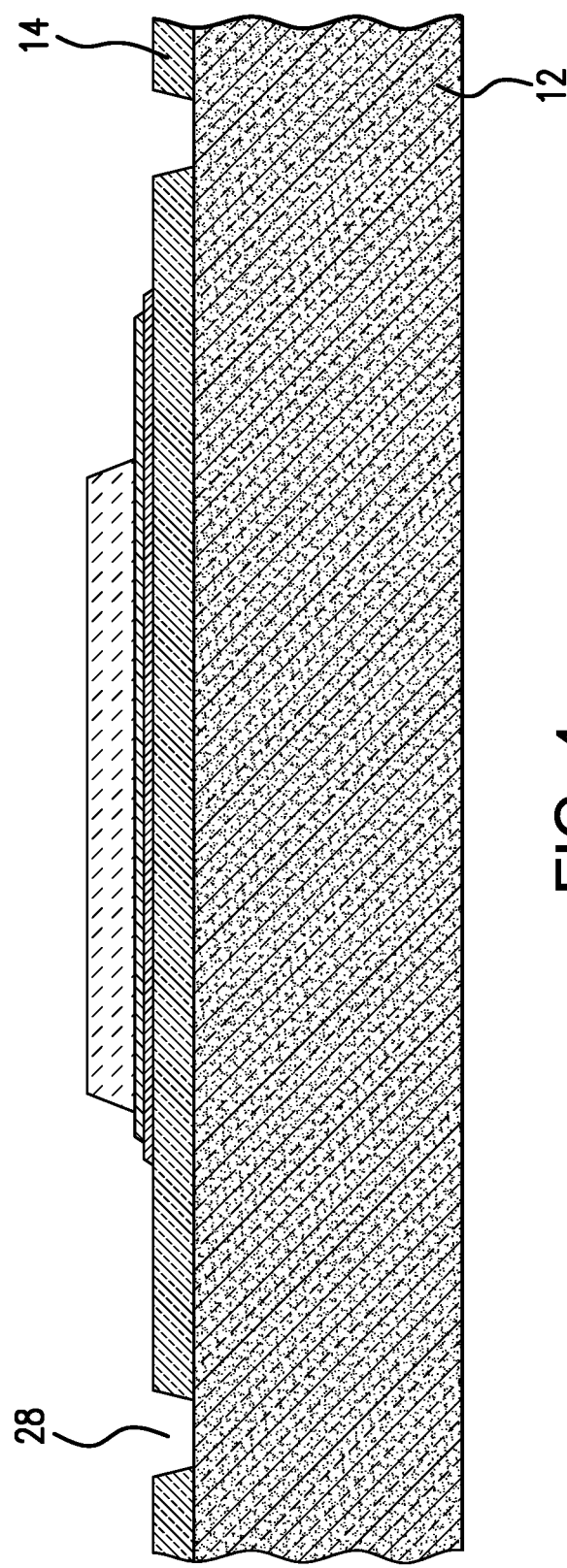
FIG. 4 illustrates a buffered oxide etch through a buried oxide layer in accord with a fourth step of the method of manufacture.

FIG. 4 illustrates a buffered oxide etch through the buried oxide layer. The buffered oxide is typically hydrofluoric acid (HF) that is buffered to slow down and better control the etch rate. The buffered HF will etch through $SiO_2$ but not the silicon handle 12. Etched portions 28 facilitate singulation of finished product by removal or scribing of the silicon handle 12 after manufacture is complete.

Figure 5:
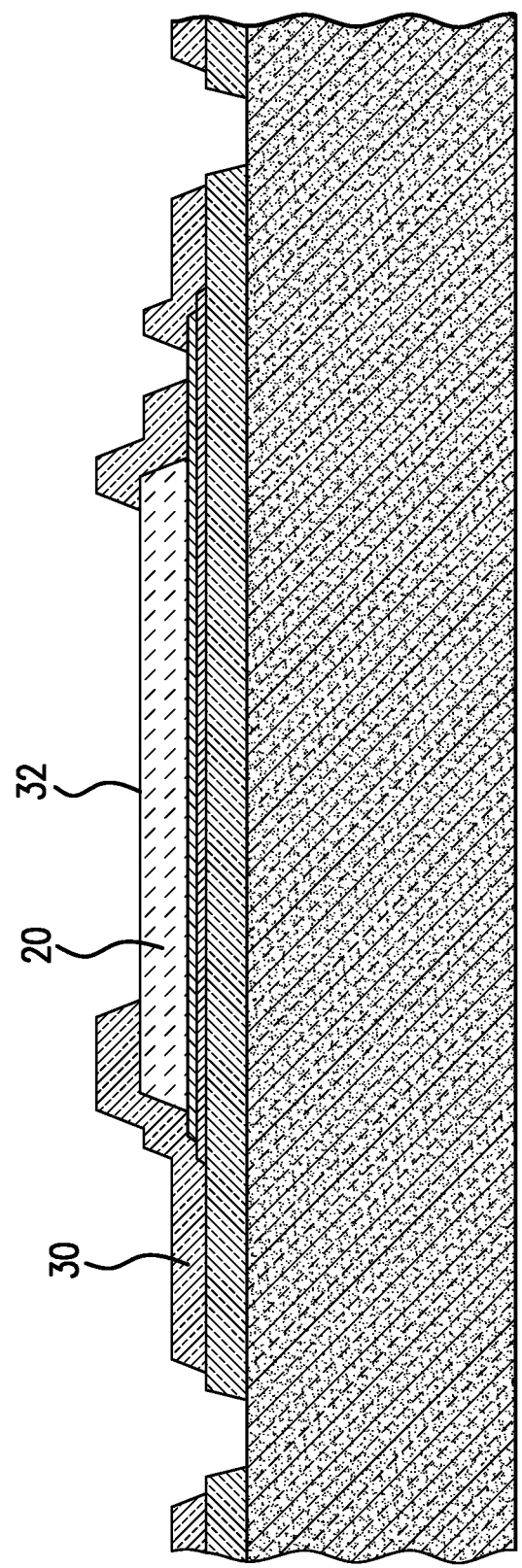
FIG. 5 illustrates a deposition of a passivation layer on top surfaces in preparation for deposition of a second (top) electrode in accord with a fifth step of manufacture.

FIG. 5 illustrates deposition of a passivation layer 30 on top surfaces in preparation for deposition of second (top) electrode material. Passivation layer is 30 is preferably an $SiO_2$ layer selectively deposited over most surfaces except central portion 32 of the piezoelectric layer 20. To minimize damage to surfaces of the piezoelectric layer 20, the $SiO_2$-layer 30 is applied by a low temperature plasma deposition process to an exemplary thickness of 2.5 micrometers+/−0.1 micrometer. The stress applied to the surface is preferably less than 50 MPa (Megapascals). Utilizing low temperature plasma deposition also eliminates photoresist/polymer residue contamination of the surfaces.

Figure 6:
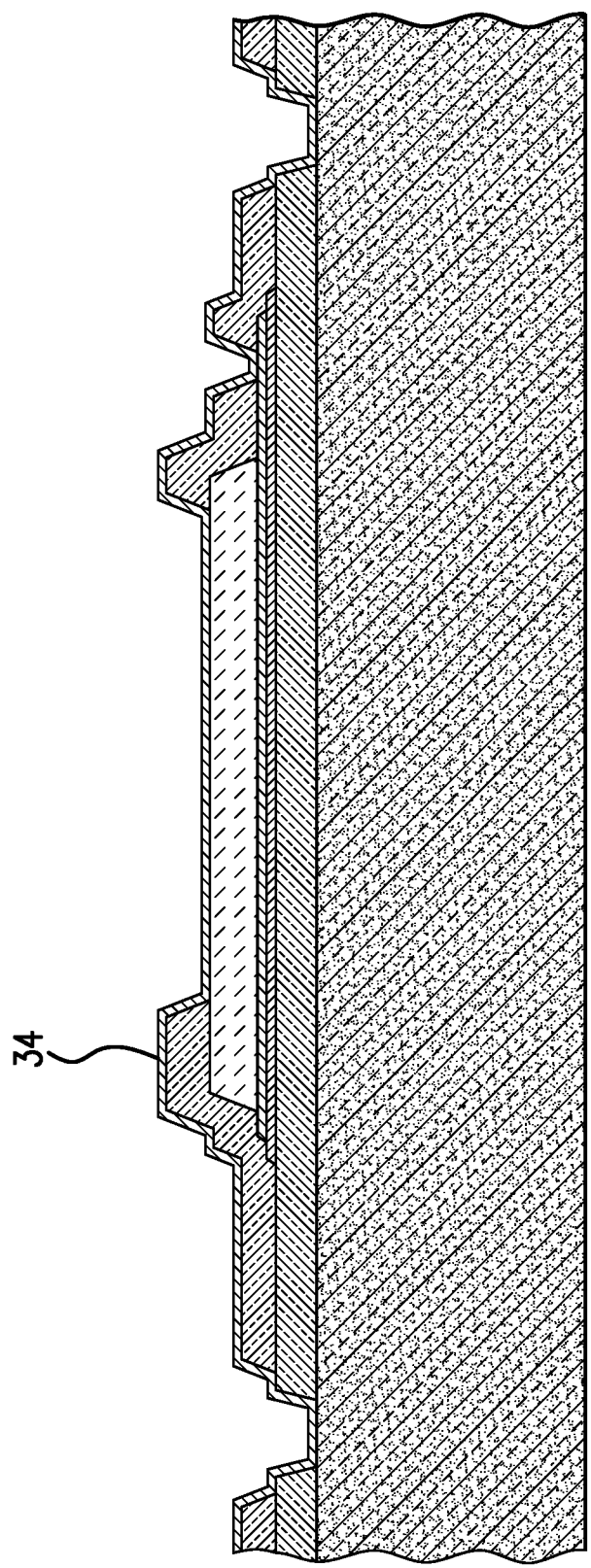
FIG. 6 illustrates deposition of a material that will form the second (top) electrode in accordance with a sixth step of manufacture.

FIG. 6 illustrates deposition of a top electrode material 34 that will form the second electrode in accord with a sixth step of manufacture. The top electrode material 34 is typically molybdenum, although other metals such as tungsten or ruthenium may also be utilized. An exemplary thickness for the top electrode material is 200 nm. The top electrode material is deposited by a process such as low temperature (150° C.) sputtering or other PVD process for a high quality deposit characterized by a high density, low stress (less than 100 MPa) and a sheet resistance of Rs=below 0.5+/−0.05 ohm/square.

Figure 7:
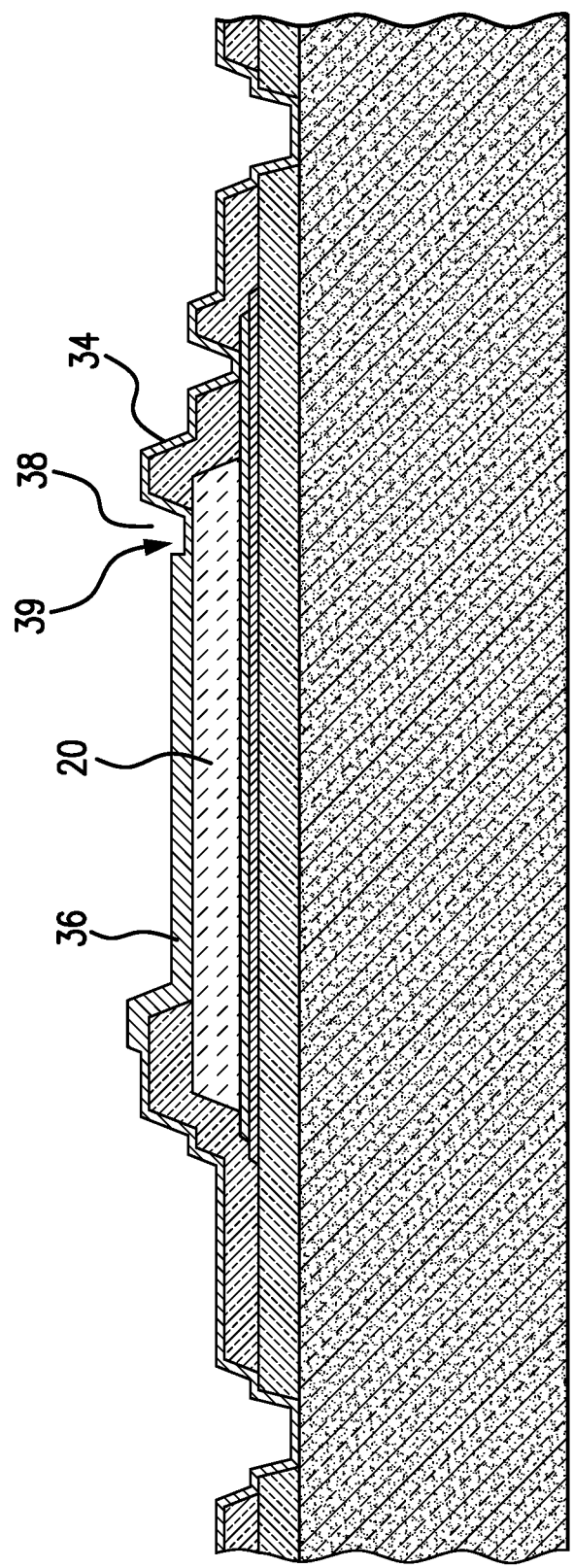
FIG. 7 illustrates mass loading of the second (top) electrode material in accord with a seventh step of manufacture.

FIG. 7 illustrates mass loading 36 of the second (top) electrode material 34 in accord with a seventh step of manufacture. An additional amount of second (top) electrode material 34 is deposited over portions of the second (top) electrode material that overlie the piezoelectric layer 20. Typically, the mass loading 36 thickness of the additional material is from 50 nm to 100 nm, dependent on design needs. Low temperature sputtering is preferred to maintain a stress on the piezoelectric layer 20 of less than 100 MPa. A peripheral region 38 terminates at a demarcation 39 between the top electrode material 34 thickness and the mass loaded 36 thickness and forms a precursor for a bifurcated end of the second electrode.

Figure 8:
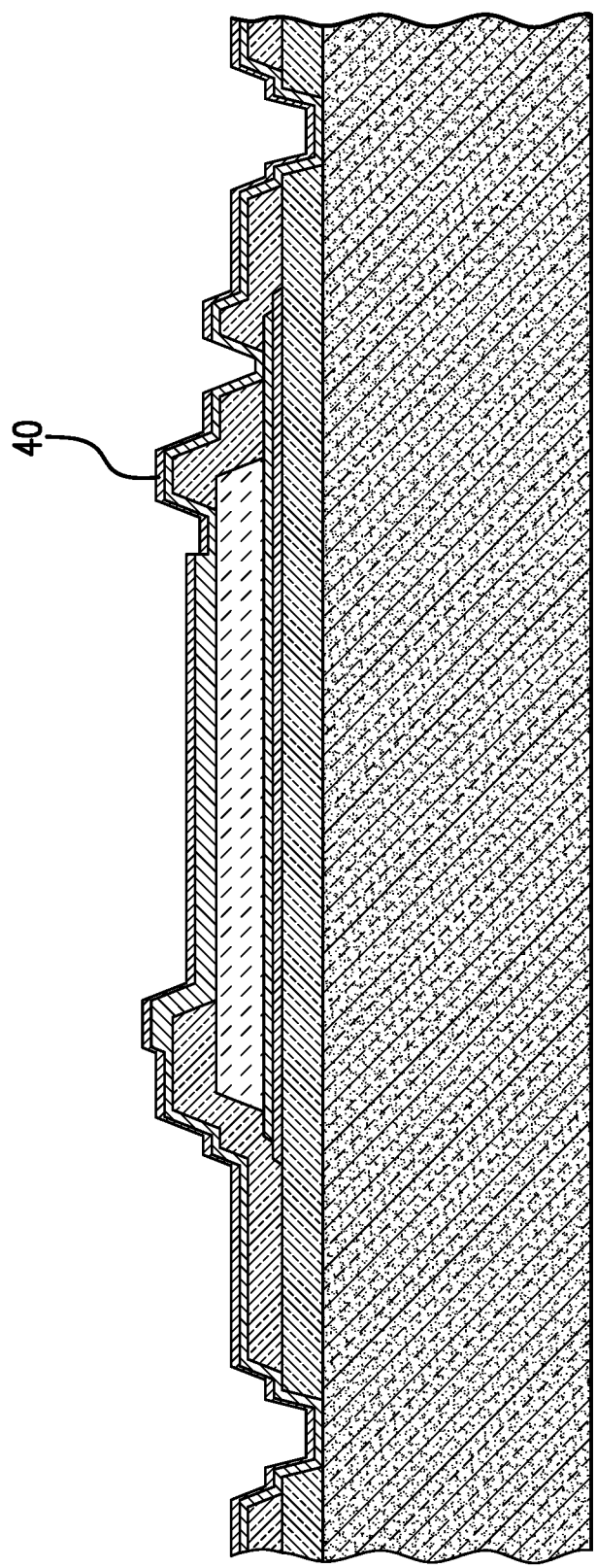
FIG. 8 illustrates deposition of a sacrificial layer used in forming an acoustic gap and a bifurcated end of the second electrode in accord with an eighth step of manufacture.

FIG. 8 illustrates deposition of a sacrificial layer 40 used in forming the acoustic gap and bifurcated end of the second electrode. Exemplary materials for sacrificial layer 40 are titanium and $SiO_2$ applied to a thickness of between 20 nm and 50 nm dependent on desired gap dimensions. The sacrificial layer 40 is applied by a method that achieves a low stress, less than 100 MPA, coating.

Figure 9:
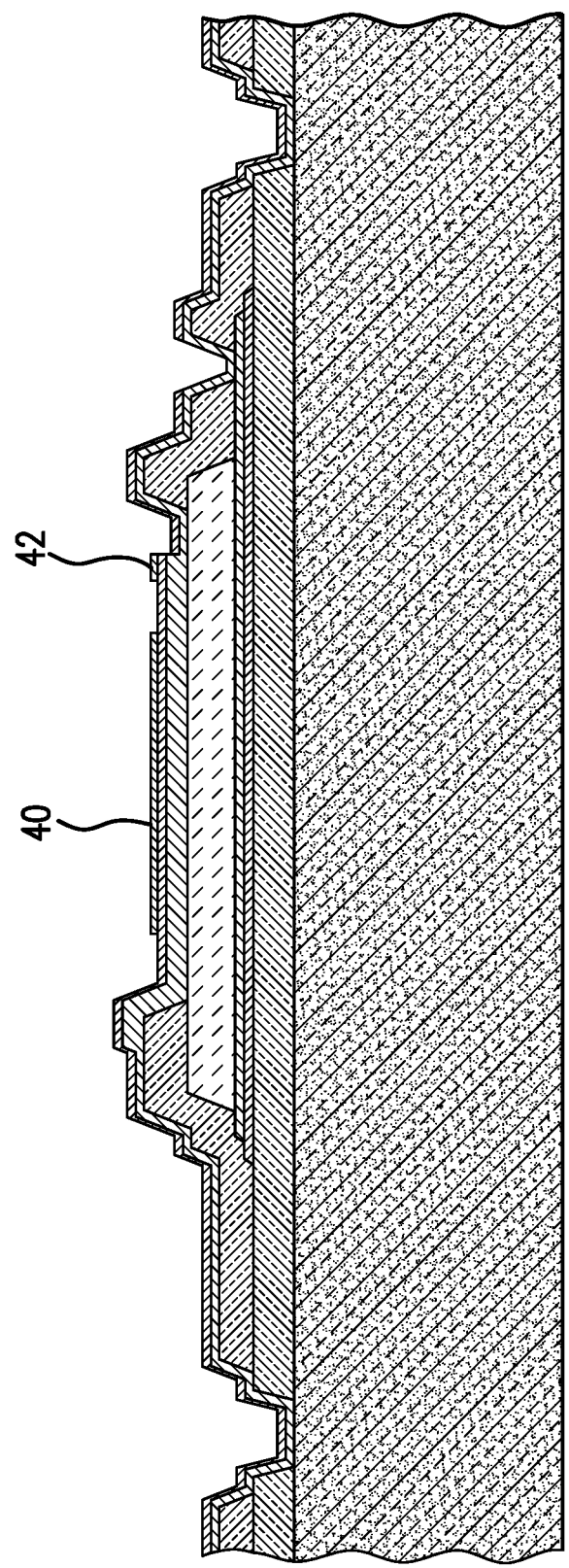
FIG. 9 illustrates selective removal of a portion of the sacrificial layer to form a precursor of the acoustic gap and bifurcated end in accord with a ninth step of manufacture.

FIG. 9 illustrates selective removal of a portion of the sacrificial layer 40 to form a precursor 42 of the acoustic gap and bifurcated end of the second electrode in accord with a ninth step of manufacture.

Figure 10:
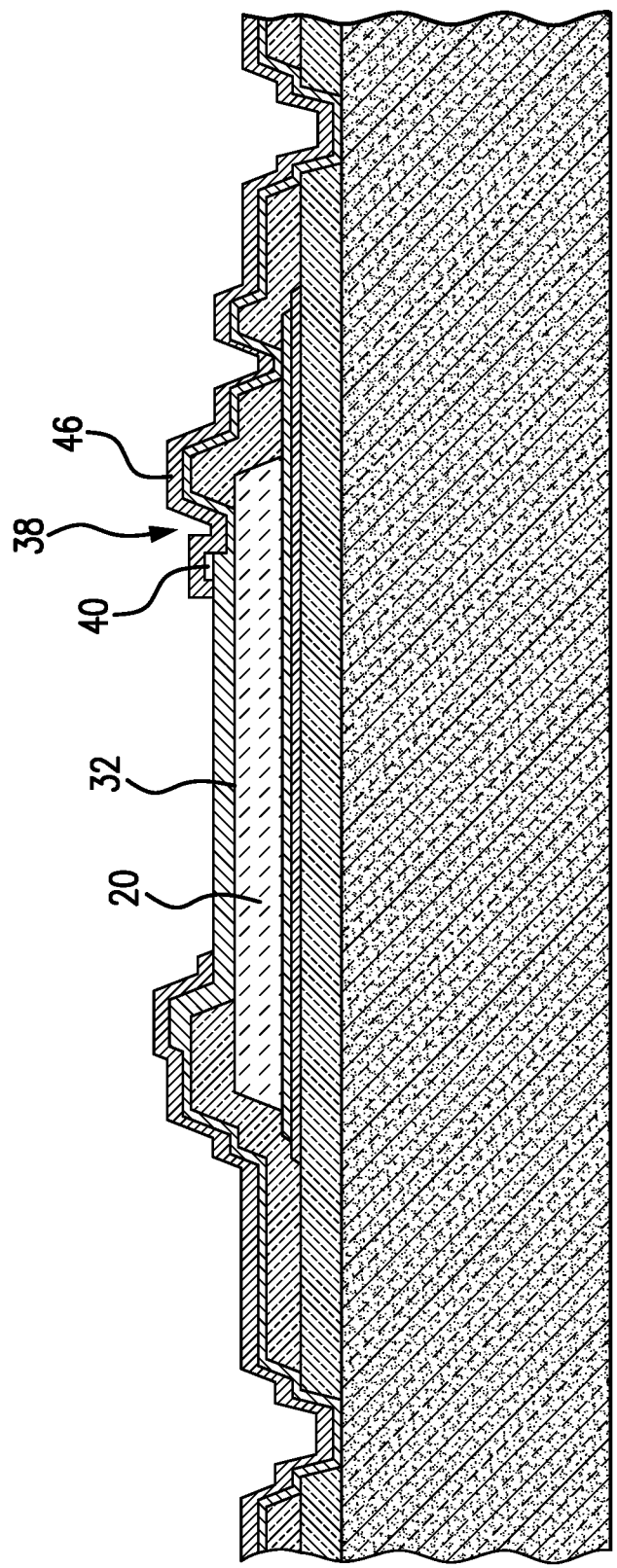
FIG. 10 illustrates selective deposition of additional second (top) electrode material in accord with a tenth step of manufacture.

FIG. 10 illustrates selective deposition of additional top electrode material 46 in accord with a tenth step of manufacture. The additional electrode material 46 encapsulates the sacrificial layer 40 at the peripheral region 38 to a thickness of from 100 nm to 150 nm and applies a low stress of less than 100 MPa. The remainder of the sacrificial layer that was overlying the central portion 32 of the piezoelectric layer 20 is removed.

Figure 11:
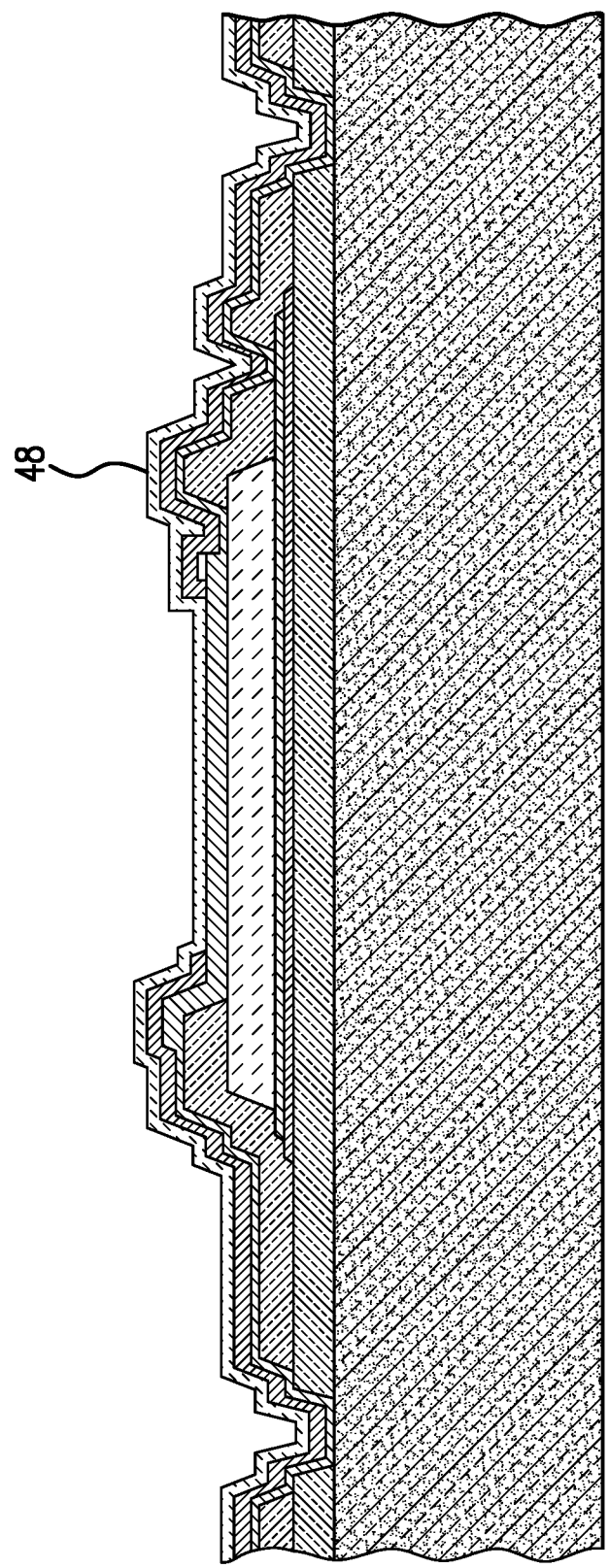
FIG. 11 illustrates a top surface passivation in accord with an eleventh step of manufacture.

FIG. 11 illustrates a top surface passivation layer 48 in accord with an eleventh step of manufacture. This top surface passivation layer is typically regular quality, not piezoelectric, aluminum nitride deposited to a thickness of 100 nm+/−10 nm.

Figure 12:
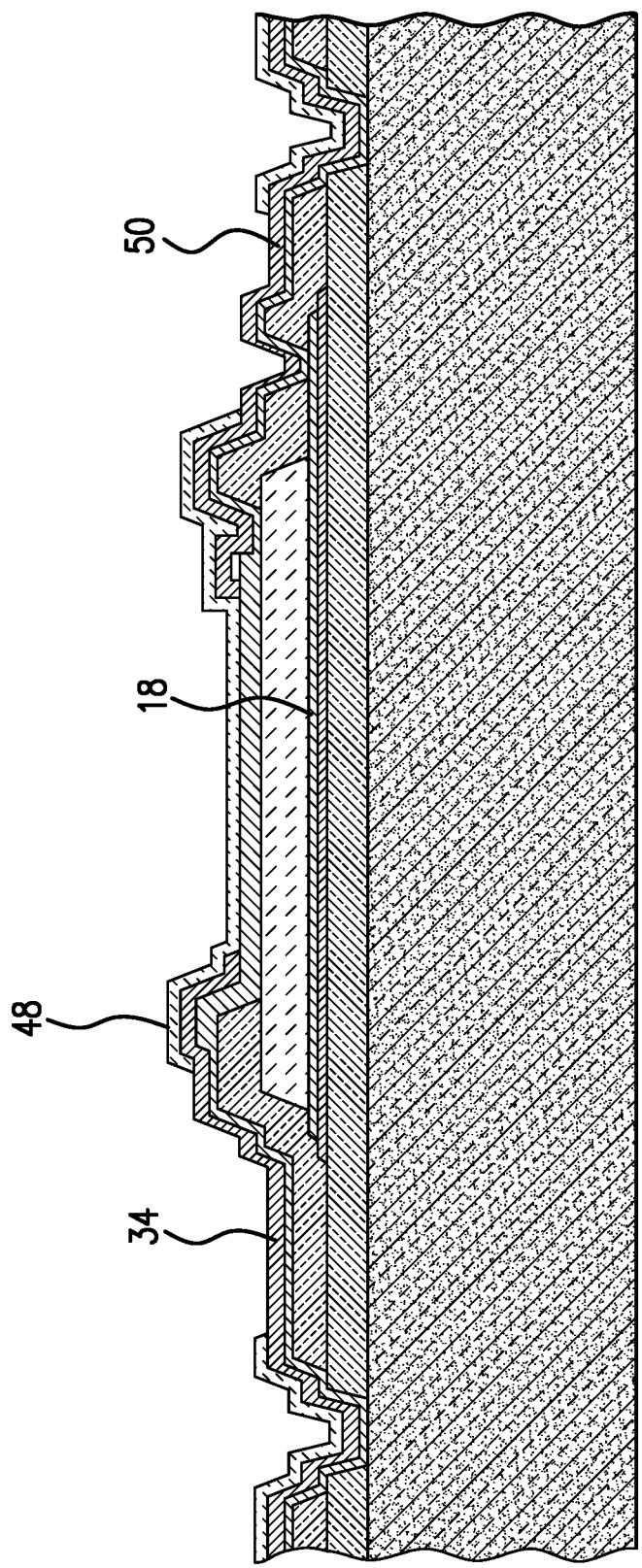
FIG. 12 illustrates selective removal of portions of the top surface passivation in accord with a twelfth step of manufacture.

FIG. 12 illustrates selective removal of the top surface passivation 48 to provide electrical interconnect regions 50 to the top electrode material 34 and the bottom electrode material 18 in accord with a twelfth step of manufacture. Removal is typically by a chemical etch effective to remove AN, but not the underlying metal (molybdenum).

Figure 13:
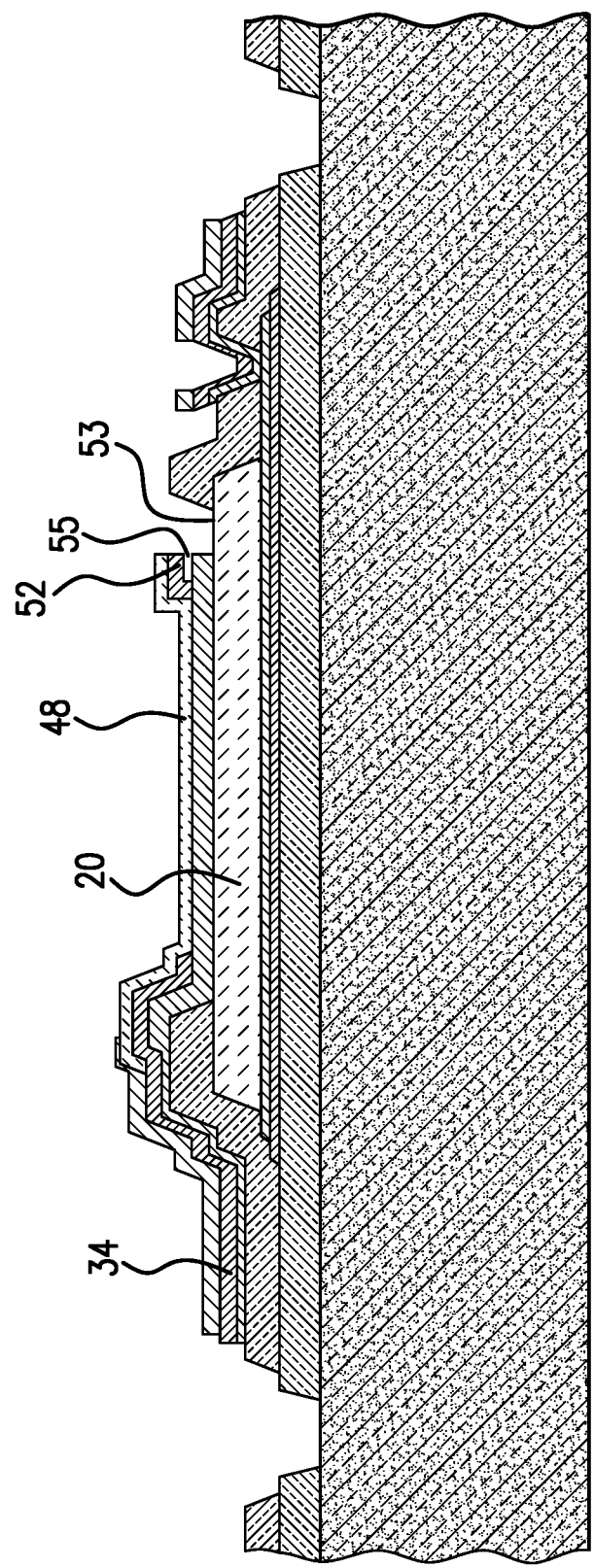
FIG. 13 illustrates selective removal of additional top surface passivation layer, second electrode material and sacrificial layer to form the bifurcated end of the second electrode in accord with a thirteenth step of manufacture.

FIG. 13 illustrates selective removal of more of the top surface passivation 48, the second electrode material 34 and the sacrificial layer to form the bifurcated end 52 of the second electrode in accord with a thirteenth step of manufacture. The top surface passivation and the second electrode material are removed by etching prior to removal of the sacrificial layer. Both layers may be etched at the same time using an etch that will not attack the piezoelectric layer 20 nor significantly increase the roughness of the top surface 53 of the piezoelectric layer 20. KOH+$H_2O_2$ is one suitable etch solution. A clear edge cut is desired at the bifurcated end 52 so that the sacrificial layer (typically titanium or $SiO_2$) filling the gap may be removed leaving behind a well-defined acoustic gap 55.

Figure 14:
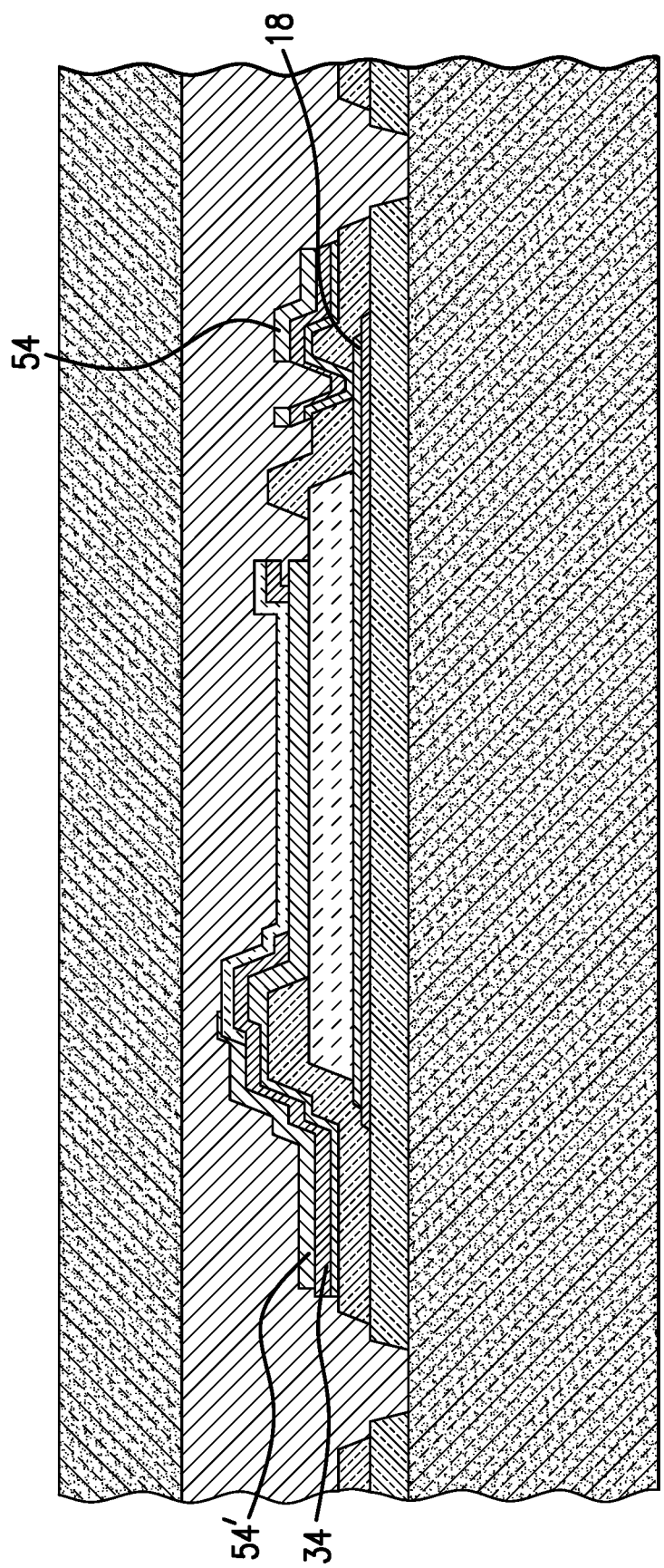
FIG. 14 illustrates the deposition of gold pads for electrical interconnects in accord with a fourteenth step of manufacture.

FIG. 14 illustrates deposition of gold pads 54, 54' for electrical interconnection to the first electrode 18 and to the second electrode 34 in accord with a fourteenth step of manufacture. Rather than pure gold, a gold alloy such as Cr/Au or Ti/Au may be used. The thickness of the gold pads is on the order of 250 nm-800 nm.

Figure 15:
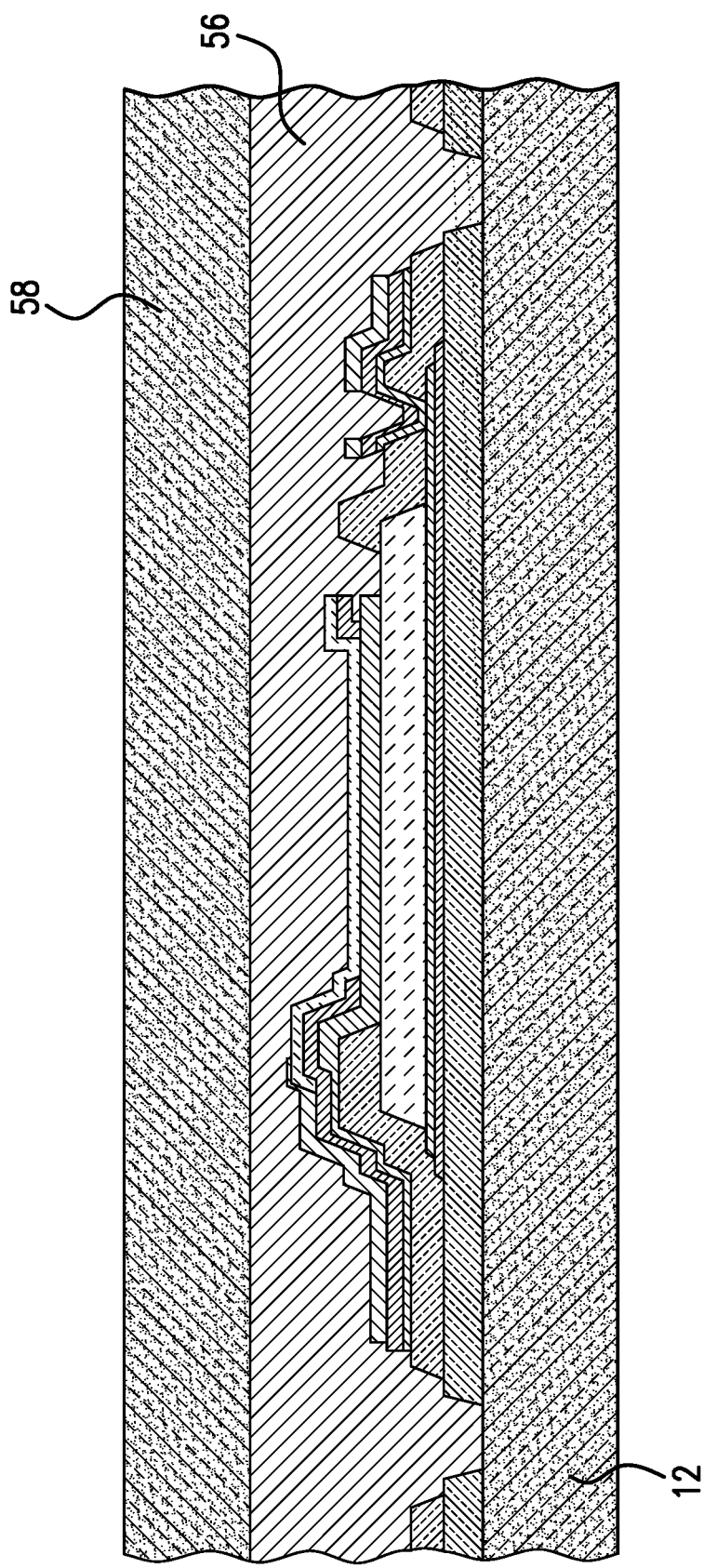
FIG. 15 illustrates adding temporary bonding material and device support material in accord with a fifteenth step of manufacture.

FIG. 15 illustrates an addition of temporary bonding material 56 and device support layer 58 in accord with a fifteenth step of manufacture. A bonding material is added as temporary bonding material 56. Suitable materials include organic material such as a tape or an ultra-violet (UV) sensitive gel. A device support layer 58, such as glass, is bonded to the temporary bonding material 56. The device support layer 58 provides rigidity and front side protection to the device when the silicon handle 12 is thinned in a subsequent manufacturing step. The thickness of the silicon handle 12 is reduced by mechanical grinding and polishing (either mechanical, chemical, or chemical mechanical polishing). The thickness of the silicon handle 12 is reduced to between 50 micrometers and 100 micrometers depending on design needs.

Figure 16:
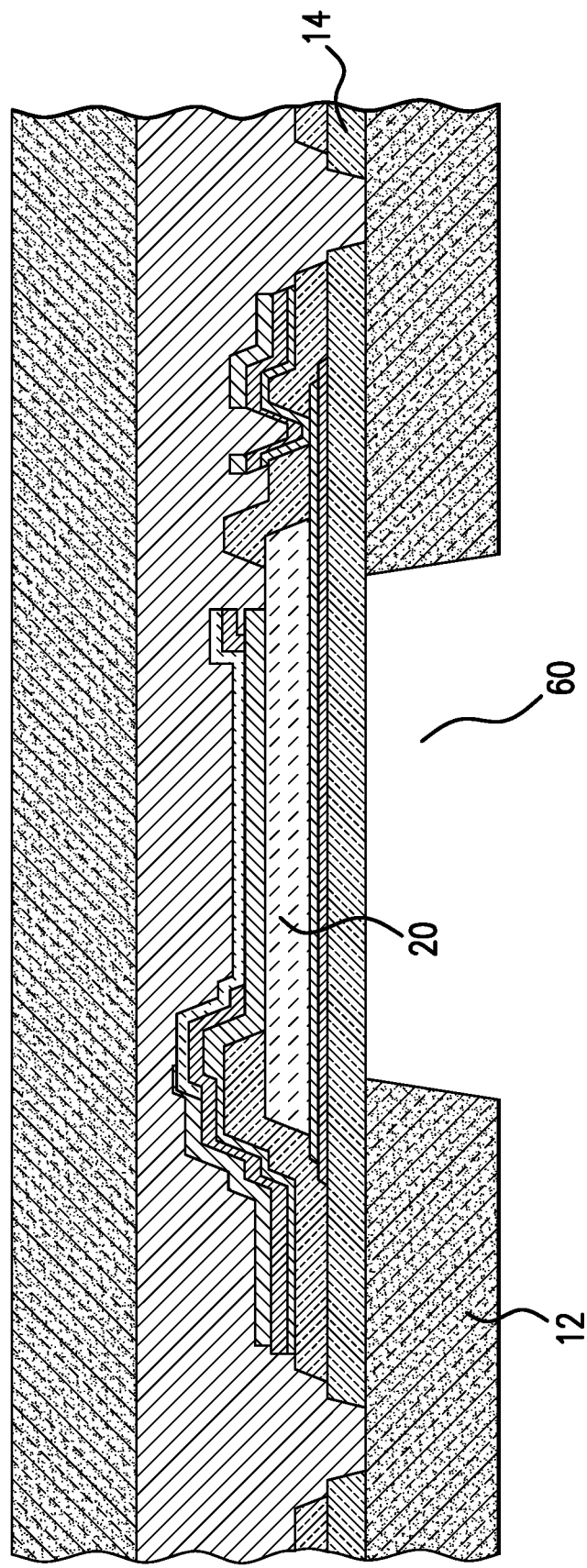
FIG. 16 illustrates removal of a portion of the starting wafer underlying the piezoelectric layer in accord with a sixteenth step of manufacture.

FIG. 16 illustrates removal of a portion 60 of the silicon handle 12 underlying the piezoelectric layer 20 to form an acoustic gap under the piezoelectric layer. The silicon may be selectively removed by deep reactive ion etching which will stop etching on contact with the buried oxide layer 14. Use of deep reactive ion etching avoids a need for polymer-based chemical resist materials ensuring the portion 60 is polymer residue free.

Figure 17:
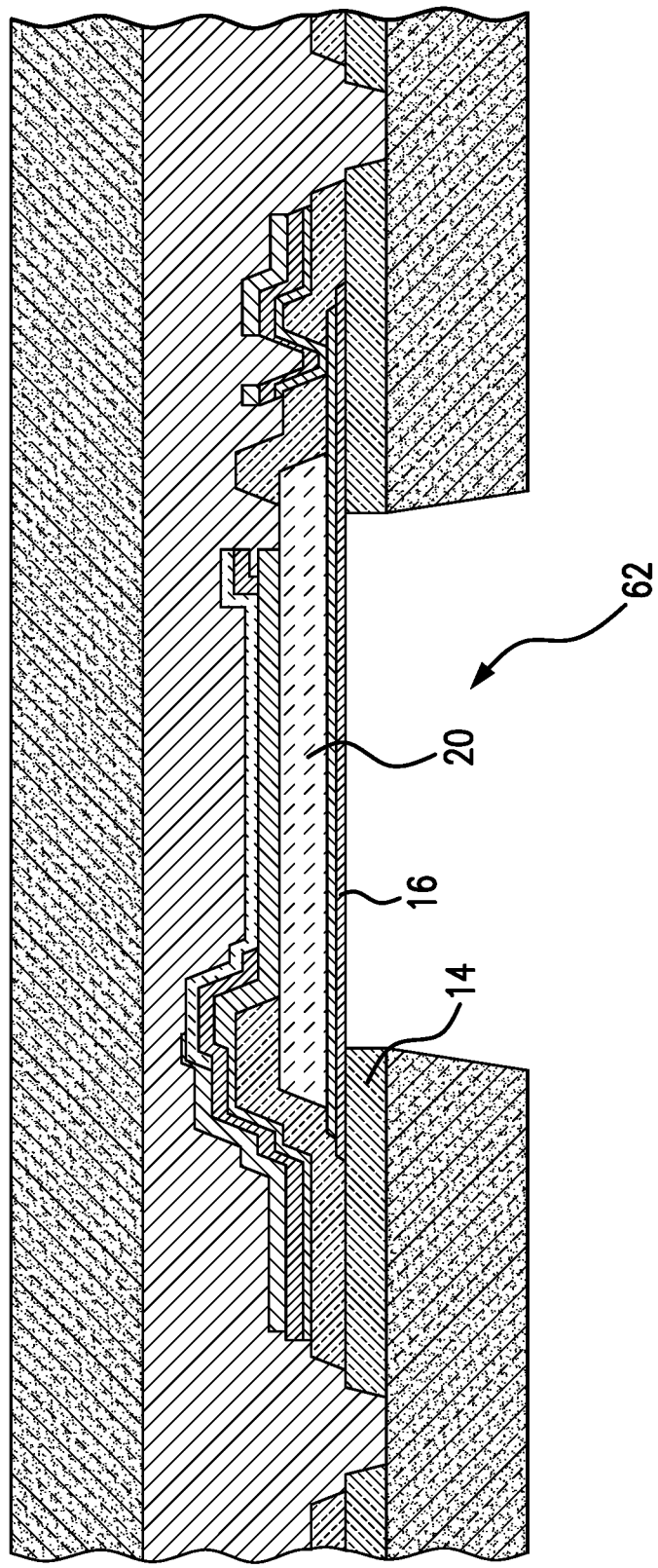
FIG. 17 illustrates removal of a portion of the buried oxide layer underlying the piezoelectric layer in accord with a seventeenth step of manufacture.

FIG. 17 illustrates removal of a portion 62 of the buried oxide layer 14 underlying the piezoelectric layer 20. Typically, a dry etch is utilized to remove the portion 62 of the buried oxide layer to form the acoustic gap under the piezoelectric layer 20 with the etch stopping on contact with the gold bonding layer 16. A dry etch is preferred, particularly if there is a titanium layer (not shown) between the buried oxide layer 14 and the gold bonding layer 16. The removal rate of titanium is difficult to control with a wet etch leading to potential side etching problems.

Figure 18:
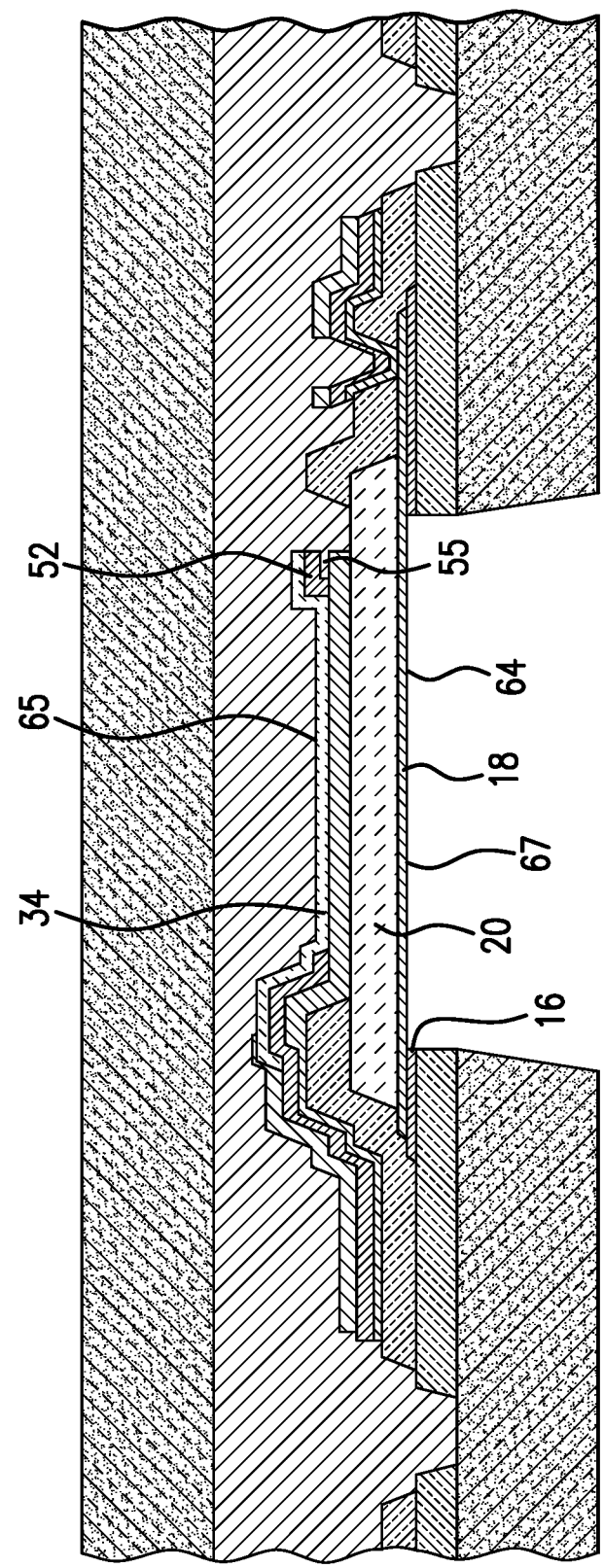
FIG. 18 illustrates removal of a portion of the gold bonding layer underlying the piezoelectric layer in accord with an eighteenth step of manufacture.

FIG. 18 illustrates removal of a portion of the gold bonding layer 16 underlying the piezoelectric layer in accord with a nineteenth step of manufacture. Removal may be by etching with KI/I2 (mixed with isopropyl alcohol (IPA) or acetone) which will stop on contact with titanium 64 coating the first electrode 18. Removal of the titanium layer 64 underlying the first electrode 18 may be by a dilute hydrofluoric acid etch (100:1 ratio, 100 parts water and 1.49%, by volume, HF) which will not etch the molybdenum first electrode 18. Bottom electrode 18 has a surface area larger than the surface area of the piezoelectric layer 20 improving power handling by the filter.

Completion of the manufacturing steps produces an acoustic resonator having a first electrode 18 having a first planar portion 67, a second electrode 34 having a second planar portion 65 disposed parallel to the first planar portion 67. The second electrode 34 further includes a bifurcated end 52 that defines a gap 55. A piezoelectric layer 20 is disposed between and contacts both the first planar portion 67 and the second planar portion 65. The bifurcated end 52 of the second electrode 34 is in direct contact, without any intervening material or gap, with piezoelectric layer 20.

The acoustic resonator is typically packaged to provide electrical interconnection to external devices or circuit boards and to provide environmental protection. One suitable package is formed from polymer resin as described in United States Patent Application Publication No. US 2021/0028766 A1, titled "Packages with Organic Back Ends for Electronic Components," by Hurwitz et al. The disclosure of US 2021/0028766 A1 is incorporated by reference herein in its entirety.

Figure 19:
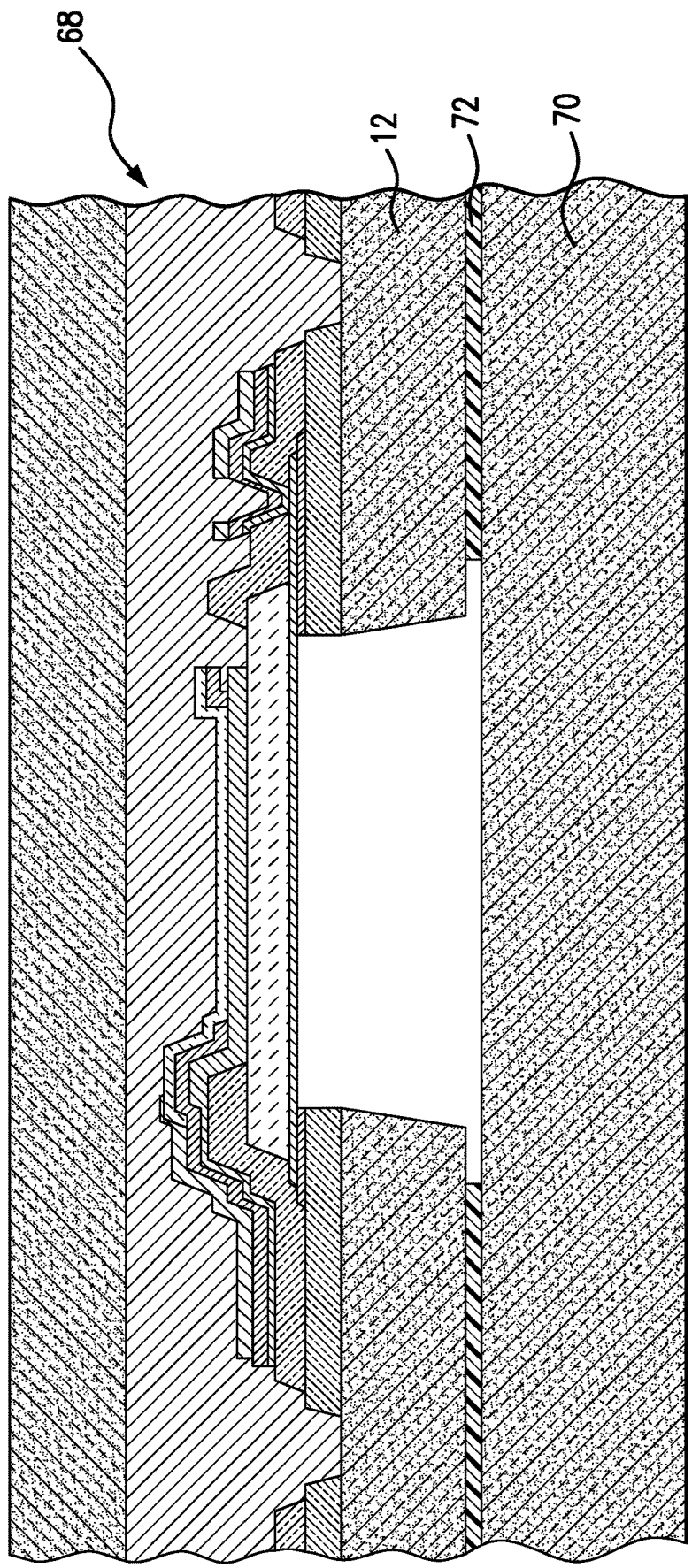
FIG. 19 illustrates a first step in encapsulating the acoustic resonator with an organic material.

FIG. 19 illustrates a first step in encapsulating the acoustic resonator 68 with an organic material. A silicon wafer cap 70 is bonded to the silicon handle 12 with an organic bonding film 72. An exemplary thickness of the silicon wafer cap is 400 micrometers. As shown in FIG. 20, with the support of the silicon wafer cap 70, both the acoustic gap material and device support layer may be removed.

FIG. 21 illustrates an organic based wafer level package 80 encapsulating a piezoelectric layer 20 that may be a component of the acoustic resonator described above. An organic wall 82, formed from a polymer such as a photo-sensitive material for permanent structure formation, contains vias coated with an under bump metallization 84 (UBM) formed from an electrically conductive material such as nickel or copper. The UBM 84 provides an electrical interconnection to the first and second electrode layers of the acoustic resonator. An organic roof layer 86 has an expanded via coated with a continuation of the UBM 84. Solder bump 88, such as a tin/silver alloy, fills the remainder of the via and extends beyond a surface 90 of the organic roof layer 86 for attachment and electrical interconnection to a device or a circuit board.

Referencing FIGS. 18 and 21, the organic based wafer level package 80 includes an acoustic resonator. The acoustic resonator has a first electrode 18 with a first planar portion 67 and a second electrode 34 with a second planar portion 65 disposed parallel to the first planar portion 67. A bifurcated end 52 of the second electrode 34 defines a gap 55. A piezoelectric layer 20 having a first side and a second side is disposed between and contacts both the first planar portion 67 and the second planar portion 65. Further, the bifurcated end 52 of the second electrode 34 contacts the piezoelectric layer 20.

An organic wall 82 contacts the first side of the piezoelectric layer 20 with a first wall via 87 extending through the organic wall 82 to contact the first electrode 18 and a second wall via 89 extending through the organic wall 82 to contact the second electrode 34. An organic roof 86 has first and second opposing sides with the first side bonded to the organic wall 82 with a first roof via aligned with the first wall via and a second roof via aligned with the second wall via. A combination of the organic wall, the organic roof and the first planar portion define a first acoustic gap 92;

A silicon handle 12 contacts the second side of the piezoelectric layer 20 and a silicon wafer cap 94 is bonded to the silicon handle 12. A combination of the silicon handle 12, the silicon wafer cap 94 and the second planar portion 67 define a second acoustic gap 96.

Persons skilled in the art will appreciate that the present invention is not limited to what has been particularly shown and described hereinabove. Rather the scope of the present invention is defined by the appended claims and includes both combinations and sub combinations of the various features described hereinabove as well as variations and modifications thereof, which would occur to persons skilled in the art upon reading the foregoing description. In the claims, the word "comprise", and variations thereof such as "comprises", "comprising" and the like indicate that the components listed are included, but not generally to the exclusion of other components.

We claim:

1. An acoustic resonator, comprising:
   a first electrode having a first planar portion;
   a second electrode having a second planar portion disposed parallel to the first planar portion, a bifurcated end of the second electrode having two separated prongs defining a gap therebetween, the two prongs having substantially the same length;
   a piezoelectric layer disposed between and contacting both the first planar portion and the second planar portion; and
   the bifurcated first end of the second electrode contacting the piezoelectric layer.

2. The acoustic resonator of claim 1 wherein the piezoelectric layer is aluminum nitride.

3. The acoustic resonator of claim 2 wherein the piezoelectric layer is a single crystal aluminum nitride.

4. The acoustic resonator of claim 3 wherein the aluminum nitride is doped with scandium.

5. The acoustic resonator of claim 1 wherein a surface of the first electrode has a larger surface area than an adjacent surface of the piezoelectric layer.

6. The acoustic resonator of claim 3 wherein a surface of the first electrode has a larger surface area than an adjacent surface of the piezoelectric layer.

7. The acoustic resonator of claim 6 wherein at least one of the first electrode and the second electrode is molybdenum.

8. The acoustic resonator of claim 7 wherein both the first and the second electrode are molybdenum.

9. The acoustic resonator of claim 6 wherein the piezoelectric layer has tapered sidewalls.

10. The acoustic resonator of claim 9 wherein the tapered sidewalls form and angle of 60° or less with a surface of the first electrode.

11. The acoustic resonator of claim 9 wherein gold or gold alloy pads are electrically interconnected to the first electrode and to the second electrode to facilitate electrical interconnection to external components or devices.

12. The acoustic resonator of claim 2 wherein the gap is filled with an acoustically transparent material.

13. The acoustic resonator of claim 12 wherein the acoustically transparent material is selected from the group consisting of air, titanium and silicon oxide.

14. An organic based wafer level package that includes an acoustic resonator, comprising:
    the acoustic resonator having:
       a first electrode having a first planar portion;
       a second electrode having a second planar portion disposed parallel to the first planar portion, a bifurcated end of the second electrode having two separated prongs defining a gap therebetween, the two prongs having substantially the same length;
       a piezoelectric layer having a first side and a second side, the piezoelectric layer disposed between and contacting both the first planar portion and the second planar portion; and
       the bifurcated first end of the second electrode contacting the piezoelectric layer;
    an organic wall contacting the first side of the piezoelectric layer with a first wall via extending through the organic wall and contacting the first electrode and a second wall via extending through the organic wall and contacting the second electrode;
    an organic roof having first and second opposing sides with the first side bonded to the organic wall with a first roof via aligned with the first wall via and a second roof via aligned with the second wall via, wherein a combination of the organic wall, the organic roof and the first planar portion define a first acoustic gap;
    a silicon handle contacting the second side of the piezoelectric layer; and
    a silicon wafer cap bonded to the silicon handle, wherein a combination of the silicon handle, the silicon wafer cap and the second planar portion define a second acoustic gap.

15. The organic based wafer package of claim 14 wherein the first wall via and the first roof via are electrically interconnected to the first electrode and the second wall via and the second roof via are electrically interconnected to the second electrode.

16. The organic based wafer package of claim 15 wherein an electrically conductive material fills the first wall via, the first roof via, the second wall via and the second roof via.

17. The organic based wafer package of claim 16 wherein the electrically conductive material extends beyond the second side of the organic roof as a solder bump.

18. The acoustic resonator of claim 17 wherein the piezoelectric layer is aluminum nitride.

19. The acoustic resonator of claim 18 wherein the piezoelectric layer is a single crystal aluminum nitride.

20. The acoustic resonator of claim 19 wherein the aluminum nitride is doped with scandium.

21. The acoustic resonator of claim 18 wherein a surface of the first electrode has a larger surface area than an adjacent surface of the piezoelectric layer.

22. The acoustic resonator of claim 21 wherein gold or gold alloy pads are electrically interconnected to the first electrode and to the second electrode to facilitate electrical interconnection to the electrically conductive material.

23. The acoustic resonator of claim 22 wherein the first acoustic gap and the second acoustic gap are filled with an acoustically transparent material.

24. The acoustic resonator of claim 23 wherein the acoustically transparent material is selected from the group consisting of air, titanium and silicon oxide.

* * * * *